United States Patent [19]
McEwan

[11] Patent Number: 5,523,760
[45] Date of Patent: Jun. 4, 1996

[54] ULTRA-WIDEBAND RECEIVER

[75] Inventor: Thomas E. McEwan, Livermore, Calif.

[73] Assignee: The Regents of the University of California, Oakland, Calif.

[21] Appl. No.: 301,924

[22] Filed: Sep. 6, 1994

Related U.S. Application Data

[63] Continuation-in-part of Ser. No. 44,745, Apr. 12, 1993, Pat. No. 5,345,471.

[51] Int. Cl.$^6$ ........................................ G01S 13/00
[52] U.S. Cl. .................................. 342/89; 375/200
[58] Field of Search ................................. 342/89; 375/200

[56] References Cited

U.S. PATENT DOCUMENTS 5,337,054  8/1994  Ross et al. ........................... 342/39
5,345,471  9/1994  McEwan ............................... 375/200
5,361,070  11/1994  McEwan ............................... 342/21

Primary Examiner—J. Woodrow Eldred
Attorney, Agent, or Firm—Henry P. Sartorio

[57] ABSTRACT

An ultra-wideband (UWB) receiver utilizes a strobed input line with a sampler connected to an amplifier. In a differential configuration, ±UWB inputs are connected to separate antennas or to two halves of a dipole antenna. The two input lines include samplers which are commonly strobed by a gating pulse with a very low duty cycle. In a single ended configuration, only a single strobed input line and sampler is utilized. The samplers integrate, or average, up to 10,000 pulses to achieve high sensitivity and good rejection of uncorrelated signals.

14 Claims, 11 Drawing Sheets

ULTRA-WIDEBAND RECEIVER

The United States Government has rights in this invention pursuant to Contract No. W-7405-ENG-48 between the United States Department of Energy and the University of California for the operation of Lawrence Livermore National Laboratory.

RELATED APPLICATIONS

This application is a continuation-in-part (CIP) of application Ser. No. 08/044,745, filed Apr. 12, 1993, now U.S. Pat. No. 5,345,471, issued Sep. 6, 1994.

BACKGROUND OF THE INVENTION

The invention relates generally to electrical signal transmission and reception, and more particularly to ultra-wideband receivers.

Direct radiation of an electrical impulse without a carrier frequency is a form of ultra-wideband (UWB) transmission which has recently received much attention for high resolution radar and spread-spectrum communications. Since an impulse contains a broad spectrum of frequencies, radars and radios that use impulsive transmitters are inherently spread-spectrum and thus present the possibility of dramatically increasing the usage of crowded airwaves through time domain channel selection rather than frequency domain channel selection. Impulse systems also promise simplified hardware implementation.

At present, a primary limitation to the development and commercialization of UWB systems has been the lack of suitable hardware. Although UWB impulse sources and antennas have received considerable recent attention, UWB receivers remain virtually undeveloped.

Prior art receivers have exclusively consisted of commercial transient digitizers and repetitive sampling oscilloscopes, both of which suffer from high costs ($30K–$100K), poor sensitivity (several millivolts), low repetition rates (10 Hz–50 kHz), and large bulk.

SUMMARY OF THE INVENTION

Accordingly it is an object of the invention to provide a UWB receiver.

It is also an object of the invention to provide a simple, compact, low cost, highly sensitive UWB receiver.

It is another object of the invention to provide a high repetition rate, low peak power UWB receiver.

The invention is a UWB receiver which has a preferred differential embodiment, and an alternate single ended embodiment. Either embodiment may be constructed to operate in a voltage mode or a current mode. In the differential embodiment, positive and negative inputs are commonly strobed into a differencing amplifier. The strobe pulse width is generally a very small fraction of the strobe pulse repetition interval. The outputs of two integrating single-ended samplers driven by a common single-ended pulse generator are input into a differencing amplifier. In a single ended embodiment, only a single strobed input is applied to an amplifier. The samplers integrate, or average, up to 10,000 pulses to achieve high sensitivity and good rejection of uncorrelated signals.

This invention is a receiver specifically designed for the reception of UWB signals. It is simple, compact, low cost (~$10), and highly sensitive (~1 microvolt). Further, it operates at high repetition rates (>10 MHz) and has excellent system noise rejection.

An additional feature of the LTWB receiver is that it detects the difference in signals between two or more antennas, thus simplifying systems using antenna arrays. This feature may also be used in microwave directional detectors for network analyzers.

This invention is primarily intended for high repetition rate, low peak power UWB systems. High repetition rate systems can be used to generate substantial average transmit power levels while keeping peak power levels at a low, practical level. When combined with a random, or dithered, Pulse Repetition Interval (PRI), the UWB emission spectrum can be spread to the point where it resembles thermal noise to aid in interference reduction. The high sensitivity of this invention permits average transmit power to be reduced to less than one microwatt for many consumer applications, a power level that will assure FCC, OSHA, and EPA approval.

BRIEF DESCRIPTION OF THE DRAWINGS

FIG. 3b is a magnified view of the waveform of FIG. 3a.

DETAILED DESCRIPTION OF THE PREFERRED EMBODIMENTS

Four basic ultra-wideband (UWB) receivers are illustrated in FIGS. 1a–d. In the voltage mode differential configuration of FIG. 1a, negative and positive input terminals are connected through a series capacitor and resistor C1-R1, C2-R2 to the positive and negative inputs of differencing amplifier A. The input channels are commonly strobed through diodes D1, D2. The strobe line may include a capacitor $C_s$ for pulse shaping, if required, and is terminated in a resistor $R_T$. C1 and C2 act as charge holding capacitors. R1 and R2 isolate the strobe pulse from appearing at the amplifier input terminals, and from being shunted to ground by C3, C4. A parallel resistor and capacitor R3-C3, R4-C4 is also connected from each amplifier input to ground and act as integrators for voltage developed across C1, C2. In an alternate current mode differential receiver of FIG. 1b, the positive and negative input terminals are connected through C1-R1, C2-R2 to the difference amplifier A3 through additional operational amplifiers A1, A2 configured as differential transimpedance amplifiers. Current mode is preferred for diodes with higher leakage currents or for high sensitivity systems. In the voltage mode, a voltage builds up at C1, C2. In the current mode, charge on C1, C2 is immediately bled off by the transimpedance amplifiers and accumulated on integrating capacitors in the feedback loop. The single ended voltage and current mode receivers of FIGS. 1c,d have only a single strobed input line connected to an amplifier A. A single input terminal is connected through C1-R1 to the positive input of A in FIG. 1c, and to the negative input of A in FIG. 1d. The other input of A is connected to ground as a reference. Thus a differencing amplifier is not needed for the SE configurations since ground can be used as a reference for the amplifiers.

Figure 2A:
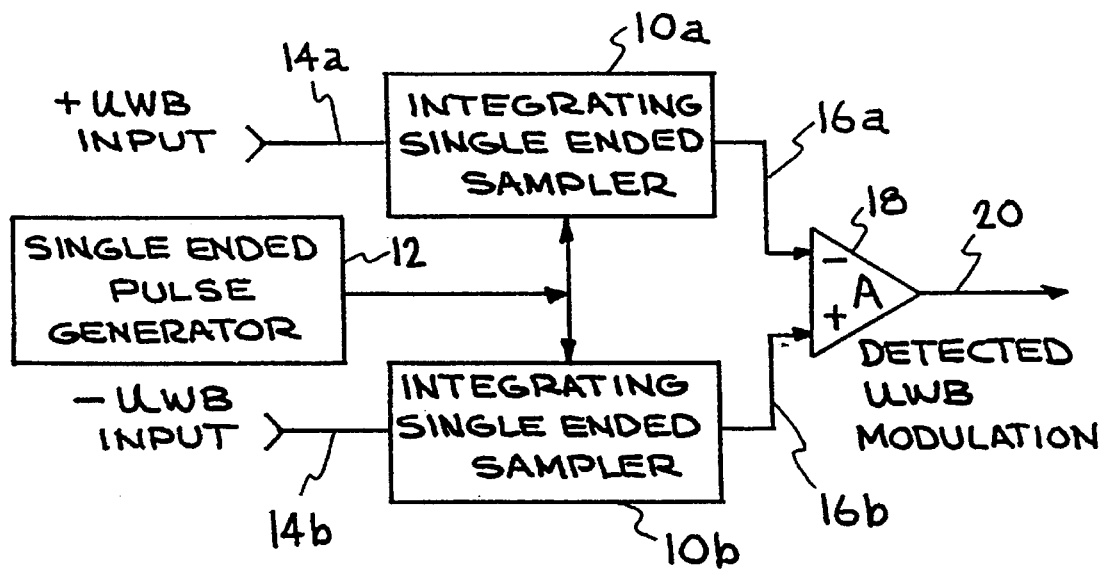
FIG. 2a is a block diagram of a differential UWB receiver.

A block diagram of a differential UWB receiver of the invention in FIG. 2a shows two integrating single-ended (SE) samplers 10a,b driven by a common, SE pulse generator 12. Single-ended means single input and output lines 14a,b and 16a,b, as opposed to differential, or balanced structures that use two lines to carry the signal or pulse waveforms in mirror image fashion. The outputs of the SE samplers 10a,b are combined in the differencing amplifier (A) 18 to obtain a single output 20 that represents the detected difference between the +UWB input and the −UWB input. Pulse generator 12 provides a gating pulse to samplers 10a,b. The gating pulse typically has a width which is much shorter than the pulse repetition interval (PRI), e.g. $10^{-3}$ to $10^{-6}$ of the PRI. Typical gating pulse widths are from about 5 ps to about 5 ns and PRI of about 100 ns to about 100 µs. A number of pulses are averaged, or integrated, by the samplers. The typical number of pulses integrated range from 2 to 10,000 depending on the application.

This structure performs the differencing operation at IF (intermediate frequencies) or at baseband. The frequency of the differencing operation is determined by the values of the circuit components, i.e. capacitors and resistors. Baseband refers to frequencies equal to the modulation, or intelligence carrying frequencies. For many UWB systems, the UWB input to the receiver may span several gigaHertz, while the baseband output may span only a few kiloHertz.

It is far easier to perform the differencing operation at baseband than at UWB frequencies. The differencing operation compares two UWB signals from two separate antennas, or it combines the input from the two halves of a dipole antenna, eliminating the need for a wideband balun transformer. Perhaps more importantly, common voltages produced by the SE samplers, such as bias voltages, are subtracted out.

Figure 2B:
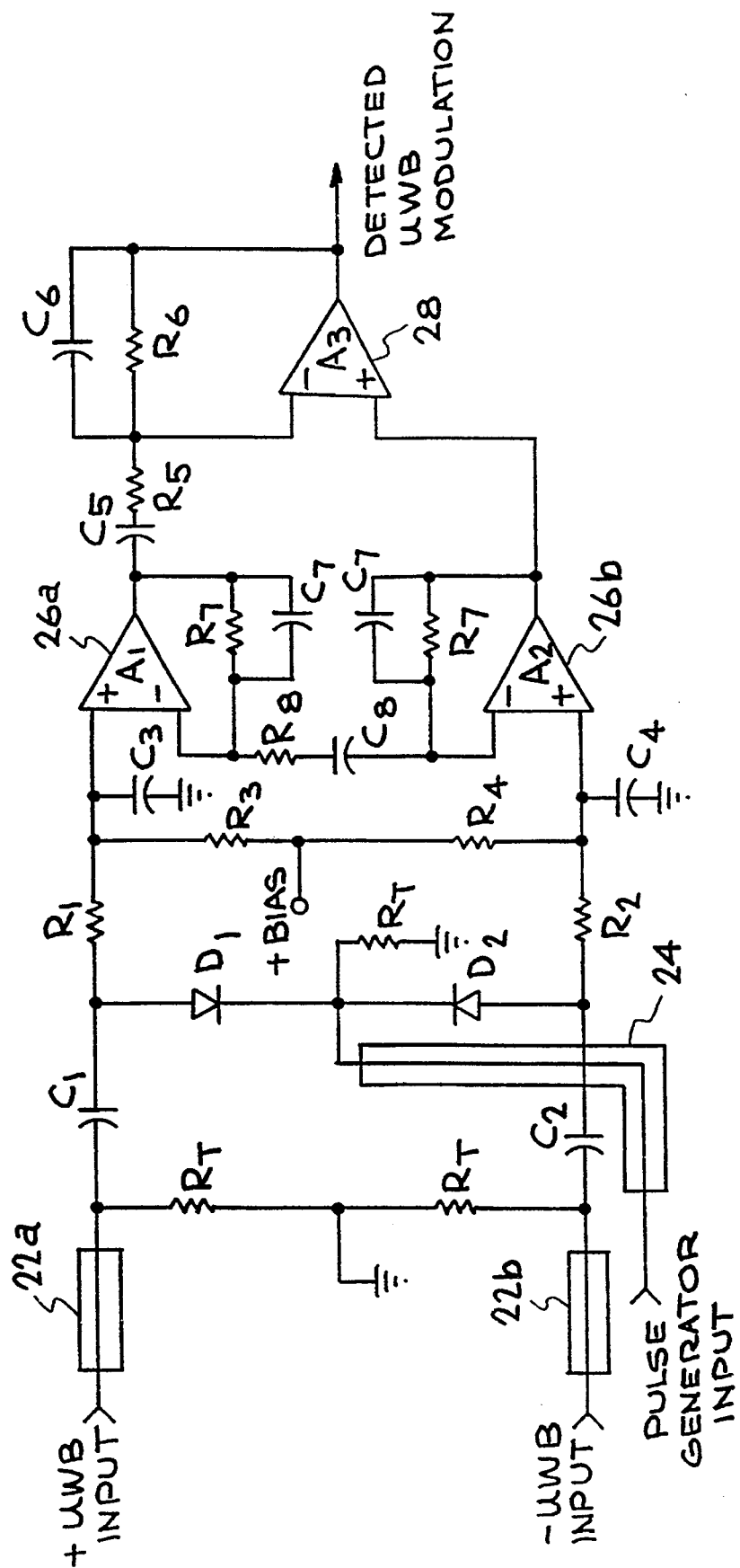
FIG. 2b is a schematic diagram of a differential UWB receiver.

A schematic of a preferred embodiment is shown in FIG. 2b. The ±UWB and pulse generator (strobe) inputs are brought to the circuit via transmission lines 22a,b and 24 which are terminated by resistors $R_T$ which are equal to the characteristic impedance of the lines.

The +UWB input is connected through line 22a, capacitor C1 and resistor R1 to the positive input of a first operational amplifier (A1) 26a. The −UWB input is connected through line 22b, capacitor C2 and resistor R2 to the positive input of a second operational amplifier (A2) 26b.

Capacitors C1 and C2 are of equal value and form signal integrators, i.e., the time constant $R_T*C1$ is substantially larger than the sampling gate width provided by the pulse generator, and the discharge times of C1, C2 are larger than the pulse repetition interval (PRI) of the pulse generator. The discharge time of C1, C2 is set by the current provided through R3, R4 connected from the positive inputs of amplifiers A1, A2 to a +Bias voltage. R3, R4 have typical values in the megohm range and C1, C2 may typically be 0.01 microfarad, for pulse generator pulse widths of 0.1 ns and a PRI of 1 microsecond.

Resistors R1, R2 isolate the UWB frequencies from amplifiers A1, A2. Their value must be high compared to $R_T$, but not so high that noise performance is degraded. A typical value is 10K ohms. The product of R1, R2 times the input capacitance of A1, A2 must be high compared to the pulse generator pulse width.

Additionally, capacitors C3, C4 may be placed from the plus inputs of A1, A2 to ground to improve isolation, and to prevent radio frequencies from the UWB inputs from appearing at the amplifier inputs, which could result in erratic performance. Only detected baseband voltages should appear at the amplifier inputs.

The output of A1 is connected through series C5 and R5 to the negative input of a third operational amplifier (A3) 28. The output of A2 is connected to the positive input of A3. The output of A3 is connected back to its negative input through parallel C6, R6. The outputs of A1, A2 are connected to their negative inputs through parallel combination C7, R7. The negative inputs of A1, A2 are also connected together through series C8 and R8. Amplifiers A1, A2, A3 form a standard high input impedance fully differential amplifier, i.e. they form the differential amplifier (A) 18 of FIG. 2a. In this embodiment, A1, A2, and A3 are J-FET input operational amplifiers contained on a single chip, part number TLO-74 by Texas Instruments. C5-R5 and C6-R6 function as differentiators and integrators, respectively, or in combination, as a baseband bandpass filter.

A pair of diodes D1, D2 are connected in series, cathode to cathode, from the junction between C1 and R1 to the junction between C2 and R2. Pulse generator input transmission line 24 is connected to the junction between D1 and D2.

The polarity of diodes D1, D2 and the polarity of the associated bias (+Bias) and gate pulse in FIG. 2b may be reversed with no essential change in performance. Also, D1 and C1 may be interchanged as well as D2, C2 with essentially the same performance.

As a receiver, this invention provides high sensitivity, high gain, and high selectivity. High sensitivity is achieved through a high level of signal integration and high detection efficiency. High sensitivity is only practical when extraneous noise sources can be rejected through pulse integration.

High gain is provided by the baseband differential amplifier, which in many cases may consist of low cost operational amplifiers.

High selectivity is attained through high levels of time coherent, repetitive signal sampling and averaging. Further, when combined with PRI dithering or pseudorandom PRI modulation, extraneous signals are more completely "averaged out". For this to work, a UWB receiver must not produce extraneous outputs when the PRI is modulated. Prior art samplers, such as commercially available sampling oscilloscopes, exhibit low tolerance to PRI modulation, i.e. they exhibit jitter; further, they cannot operate at PRI's shorter than 20 microseconds. In this invention, the minimum PRI is limited only by the pulse generator, and PRI variations are rejected by the common-mode rejection of the differential amplifier.

Figure 3A:
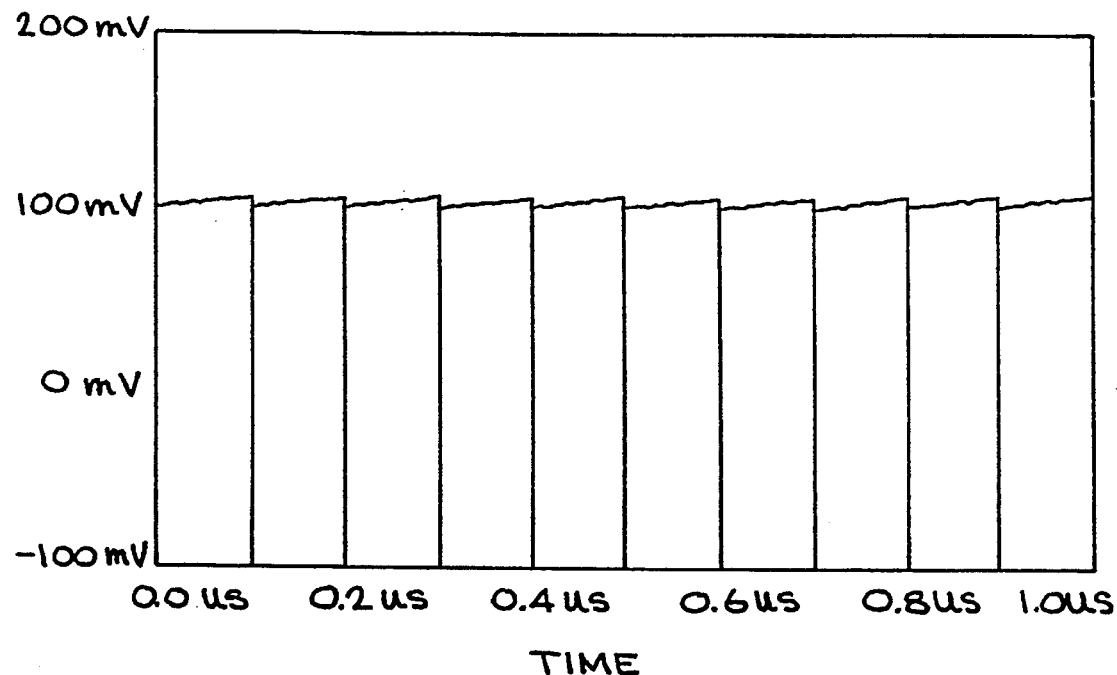
FIG. 3a shows a simulated integrated detection voltage waveform at the junction of C1 and D1 in FIG. 2.
Figure 3B:
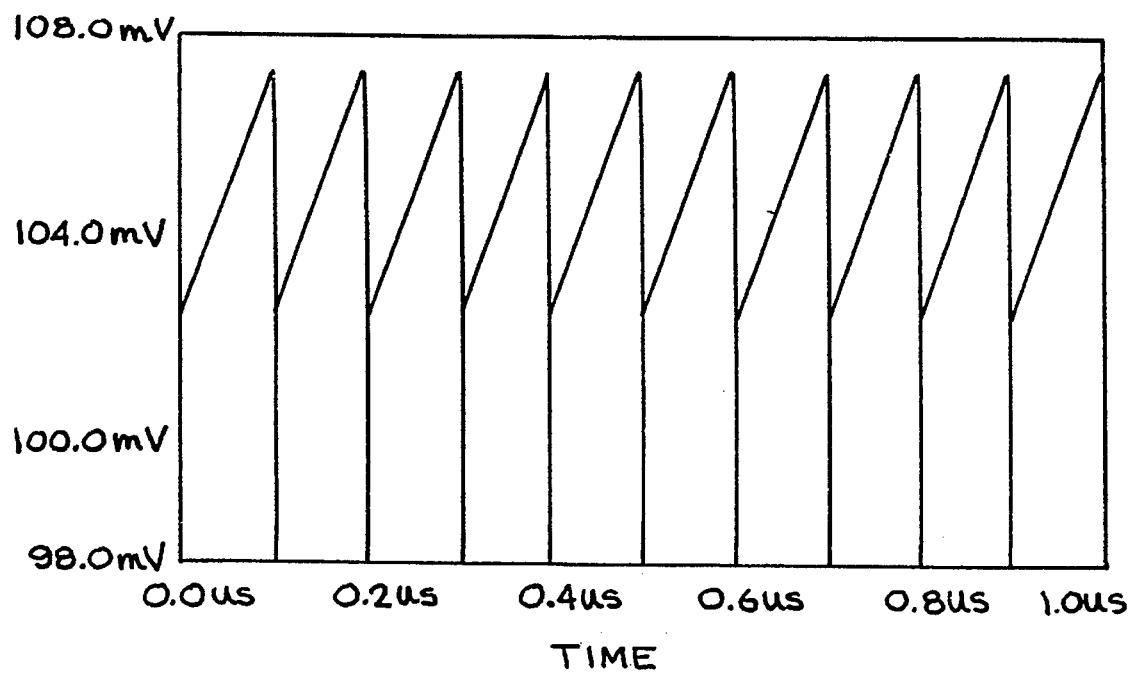

FIG. 3a shows a numerical simulation of the integrated detection voltage waveform appearing at the junction of C1 and D1 with a PRI of 0.1 microseconds and a pulse width of 0.2 ns. There is an average bias level of 100 mV, whereas this level would be ~500 mV without the application of the pulse generator. Thus the average rectified gate pulse generator signal is –400 mV. FIG. 3b shows the waveform of FIG. 3a magnified about the average bias level, where the voltage on C1 is seen to ramp up between pulse generator spikes. This is due to the bias current flowing through R3 in FIG. 2b.

Figure 3C:
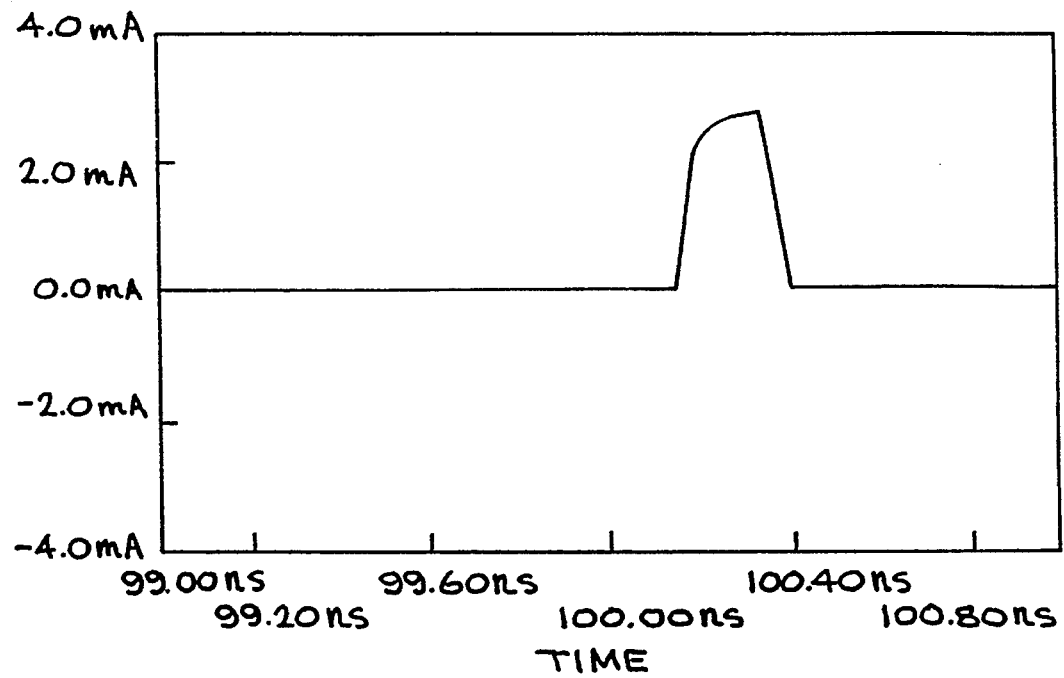
FIG. 3c shows the current through D1.

FIG. 3c shows a time-scale magnification of the current through D1 for a pulse width of 0.2 ns and PRI of 0.1 microsec. The diode current is seen to flow for ~0.2 ns, the duration of which is related to the charge and discharge rates of C1 and the applied pulse width.

The waveform in FIG. 3a approximates the integrated average of the difference between the gate pulse generator input and the signal input. Further averaging occurs in the differential amplifier, or in a low pass filter placed after the differential amplifier, and results in a smooth level when no UWB input is applied.

Figure 4:
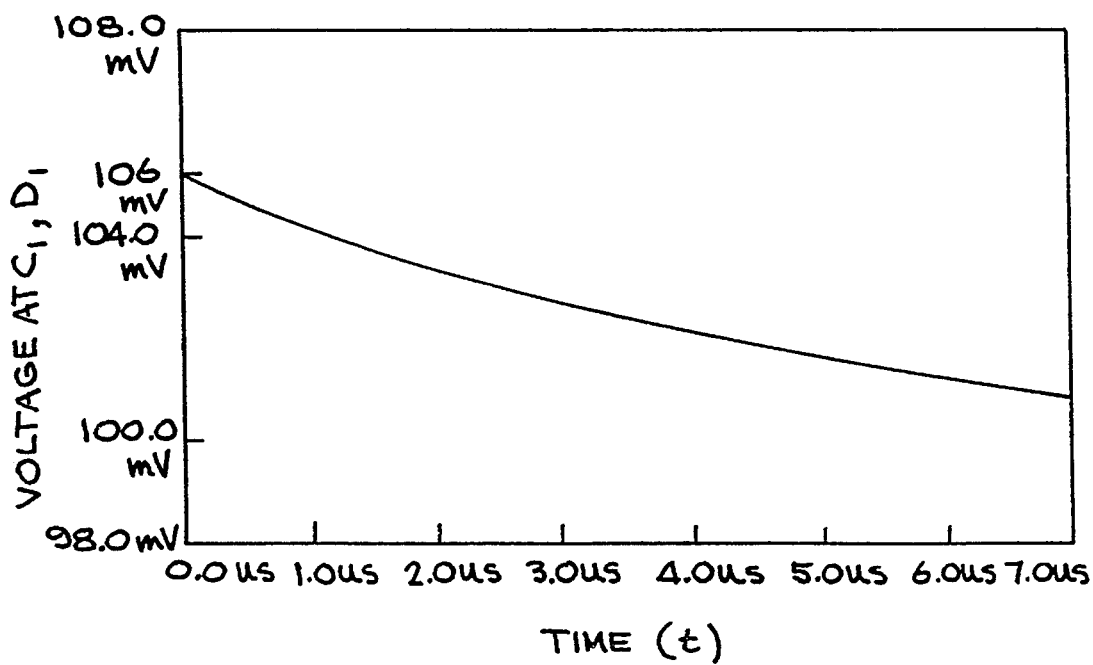
FIG. 4 shows the detection voltage response at the C1, D1 junction for a 5 mV input step.

FIG. 4 is a magnification of the voltage appearing at the junction of C1, D1, similar to FIG. 3a. At time t=0, the average voltage is 106 mV and a +5 mV step is applied to the +UWB input. The average value changes –5 mV. The minus sign results because after the gate pulse passes, the UWB input pulse returns from its +5 mV level to 0.0 V, driving the voltage at C1, D1 negative. This detector has a voltage magnitude transfer efficiency of approximately 100% from UWB input to detected output.

Figure 5:
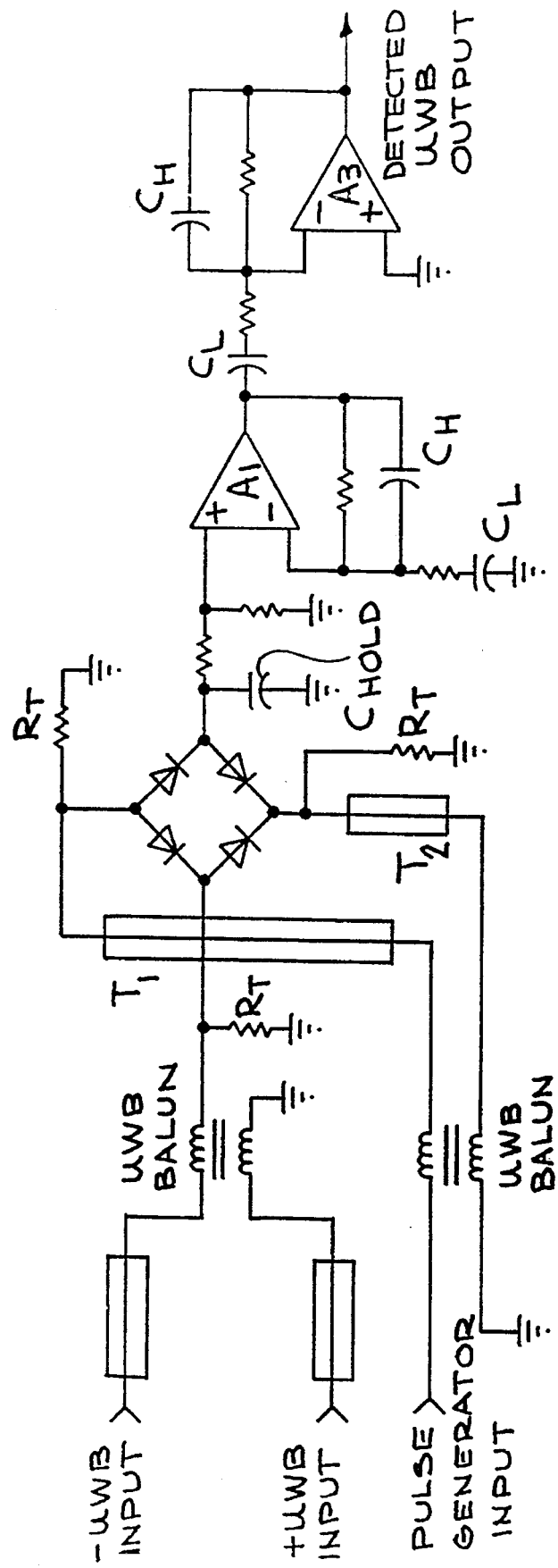
FIG. 5 is a schematic diagram of a prior art sampler.

Prior art samplers have a much lower voltage transfer efficiency. FIG. 5 shows a prior art sampler driven by a balanced pair of strobe transmission lines T1, T2. When all four diodes are driven into conduction by pulses on T1, T2, the shunting effect of the impedance of T1, T2 combined with source impedance Z and diode resistances $R_d$, result in voltage division in the transfer of the input voltage to charge holding capacitor $C_{Hold}$. The net efficiency may be ~25%. Since post-detection noise dominates the total noise, low detection efficiency means a poor signal to noise ratio on weak signals.

By symmetry, voltages seen at the junction of C1, D1 in FIG. 2b are also seen at the junction of C2, D2 when there is no UWB input. If these voltages are equal, they are differenced to zero by the differential amplifier. Thus, variations in detected voltage caused by PRI variations, gate pulse amplitude or width variations, and bias supply variations are rejected.

Figure 6:
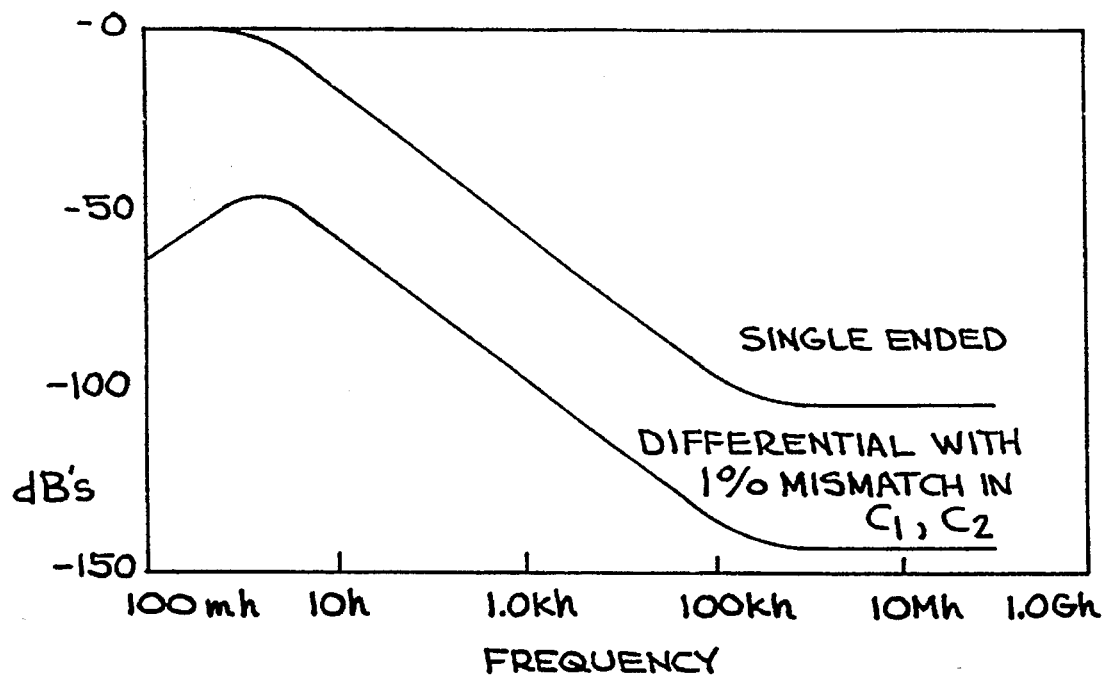
FIG. 6 illustrates rejection of bias voltage variations vs. frequency.

FIG. 6 indicates bias voltage rejection vs frequency for a 1% mismatch in the values of C1, C2. If all components were perfectly matched, rejection would be limited by the common mode rejection ratio of the differential amplifier, typically 100 dB. In practice, 40 dB of rejection for the complete circuit is typical. In contrast, the best broadband baluns, such as may be found in prior art samplers, as shown in FIG. 5 for example, may result in only a 20 dB rejection of gate pulse variations. Rejection of bias and gate pulse variations is extremely important when detecting UWB input pulses on the order of one microvolt. With only 20 dB of rejection, a 10 microvolt bias variation would appear as a one microvolt UWB signal input.

The topology of this invention lends itself to simplified signal combining while retaining the advantages of differential operation. This feature will find use in antenna array systems for synthetic beam forming and imaging radars.

Since each input, +UWB, –UWB, may be connected to an antenna feed line, the differential configuration is ideal for combining the two halves of a single dipole antenna. A common UWB antenna is the tapered slot antenna, which has two halves which generally must be connected to a coaxial transmission line via a wideband balun transformer to maintain balance and thus avoid feed line radiation or pickup. This invention eliminates the need for the wideband balun by connecting the +UWB, –UWB inputs to the two halves through two coaxial cables, or ideally, by co-locating the antenna and UWB receiver and replacing the coaxial cables with a direct connection of the two dipole halves to the two receiver inputs. Baluns are currently impossible to realize at the wide bandwidths and high levels of balance provided by this invention.

Figure 7:
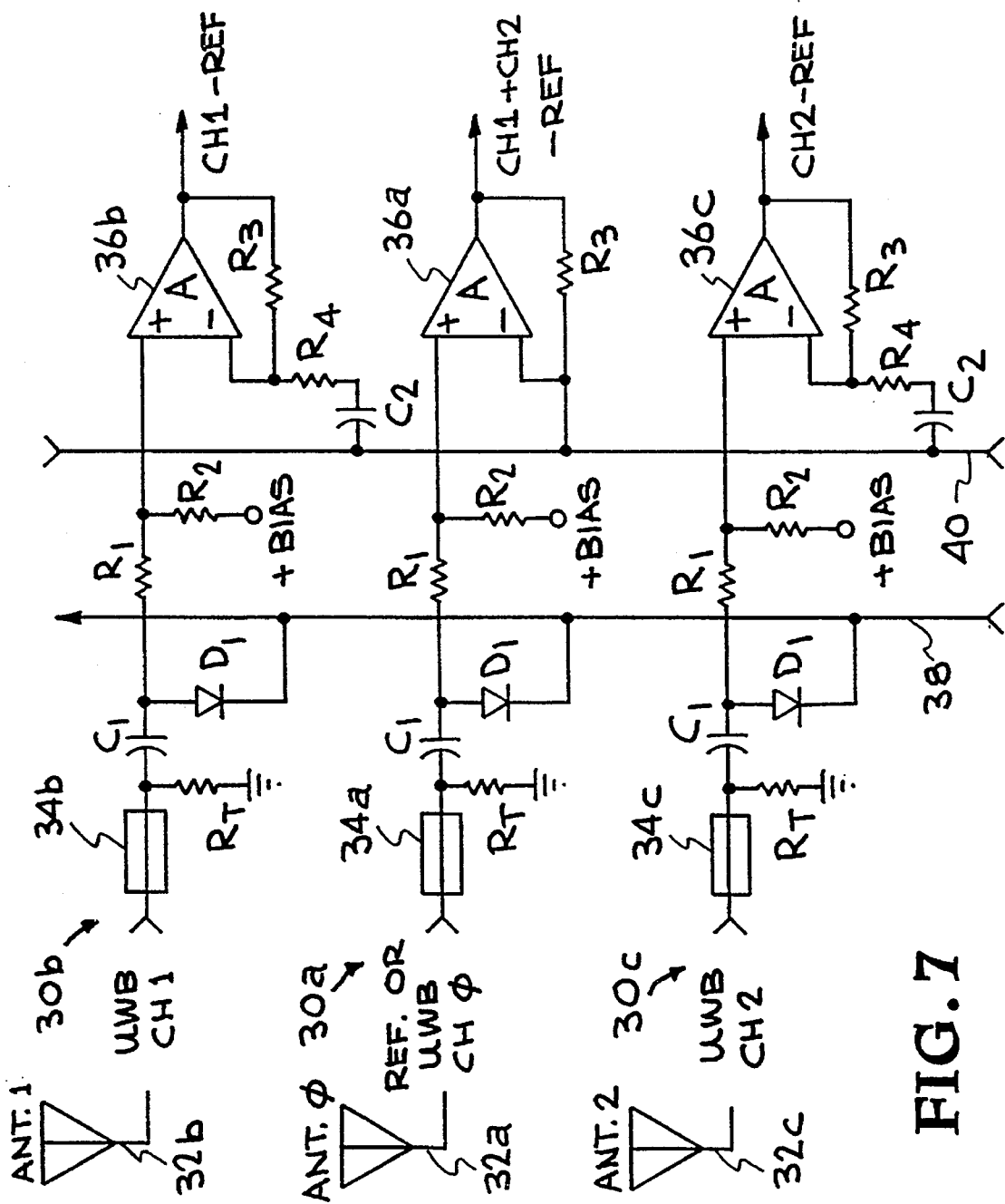
FIG. 7 is a schematic diagram of the connection of more than two antennas.

FIG. 7 shows a simple configuration to connect more than two antennas using additional SE detectors driven from a common pulse generator. Three channels 30a,b,c are shown where channel 30a may be a reference channel (REF) or UWB CH0 and channels 30b,c are UWB CH1 and CH2. Each channel is connected to a respective antenna 32a,b,c (ANT. 0,1,2). Each channel has an input transmission line 34a,b,c terminated at a resistor $R_T$. Each input line 34a,b,c is connected through a series capacitor C1 and resistor R1 to the positive input of an operational amplifier 36a,b,c. The positive inputs of amplifiers 36a,b,c are also connected to a +Bias voltage through a resistor R2. The junction between C1 and R1 on each channel is connected through a diode D1 to gate pulse input line 38. The output of each amplifier 36a,b,c is connected back to the negative input of the amplifier through a resistor R3. The negative input of amplifier 36a is also connected to baseband summation line 40, while the negative inputs of amplifier 36b,c are connected to line 40 through an impedance, represented by series resistor R4 and capacitor C2. In some cases, capacitor C2 can be omitted. Although shown with three channels, additional channels can similarly be added. Tests and numerical simulations indicate that a 50 ohm gate pulse generator of several volts in amplitude can drive ~10 SE detectors. With more amplitude, more detectors can be driven. This technique provides as outputs sums and differences of various UWB antenna inputs. It simplifies multiple embodiments of FIG. 2 while retaining high rejection of bias and gate pulse variations.

Figure 1A:
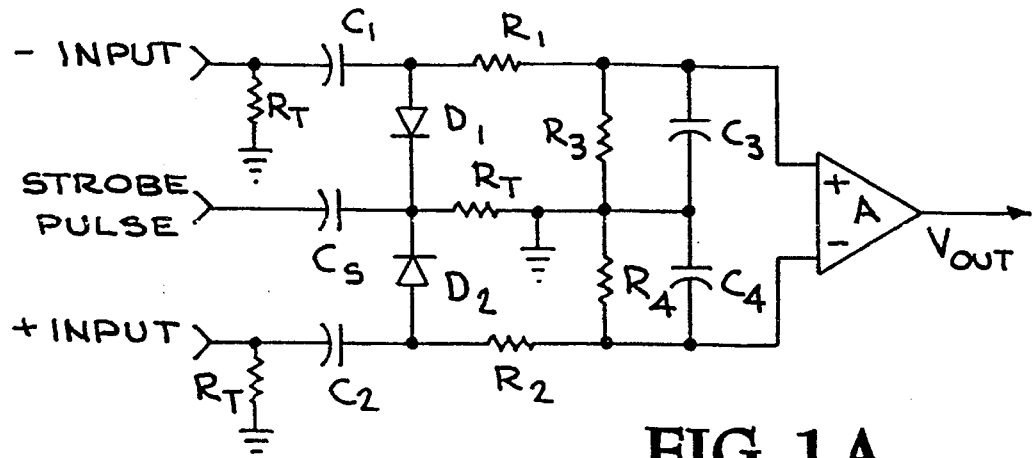
FIGS. 1a–d illustrate four basic UWB receivers.
Figure 1B:
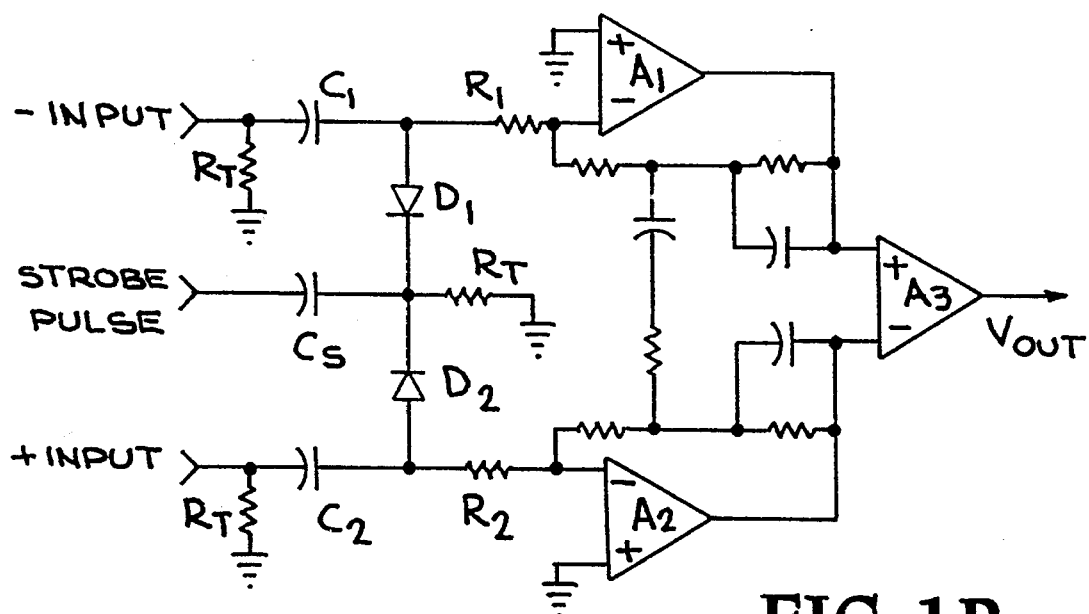
Figure 1C:
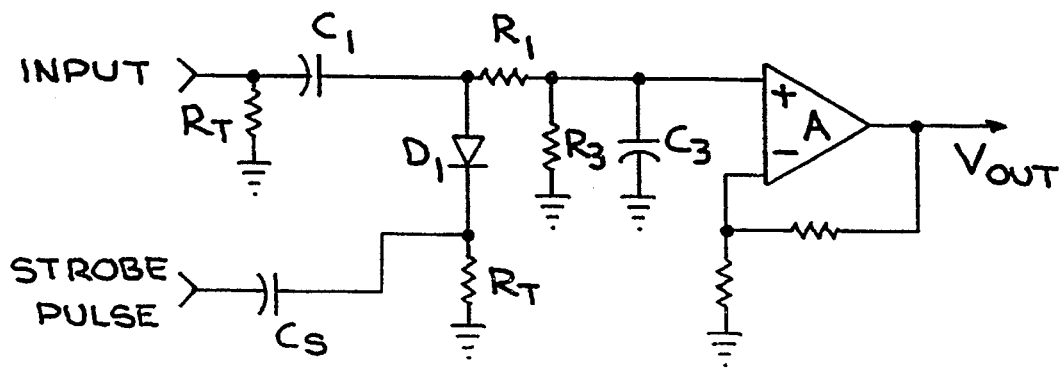
Figure 1D:
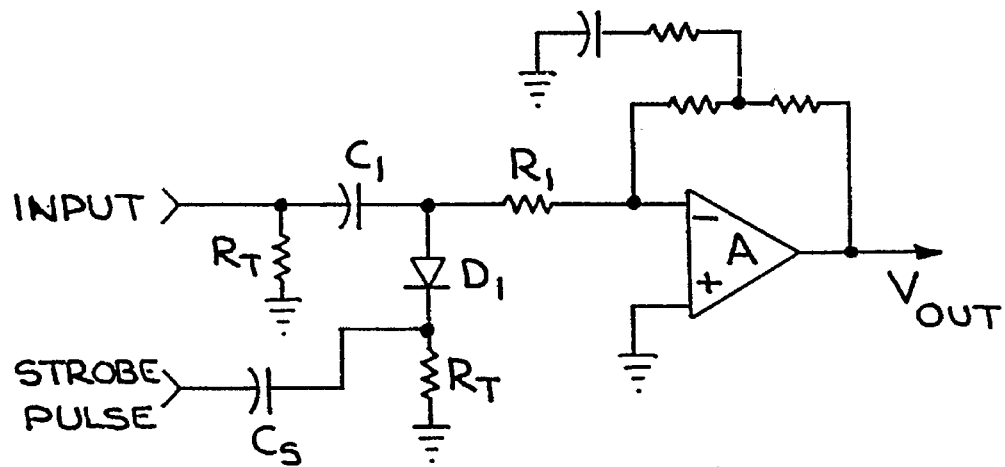
Figure 8A:
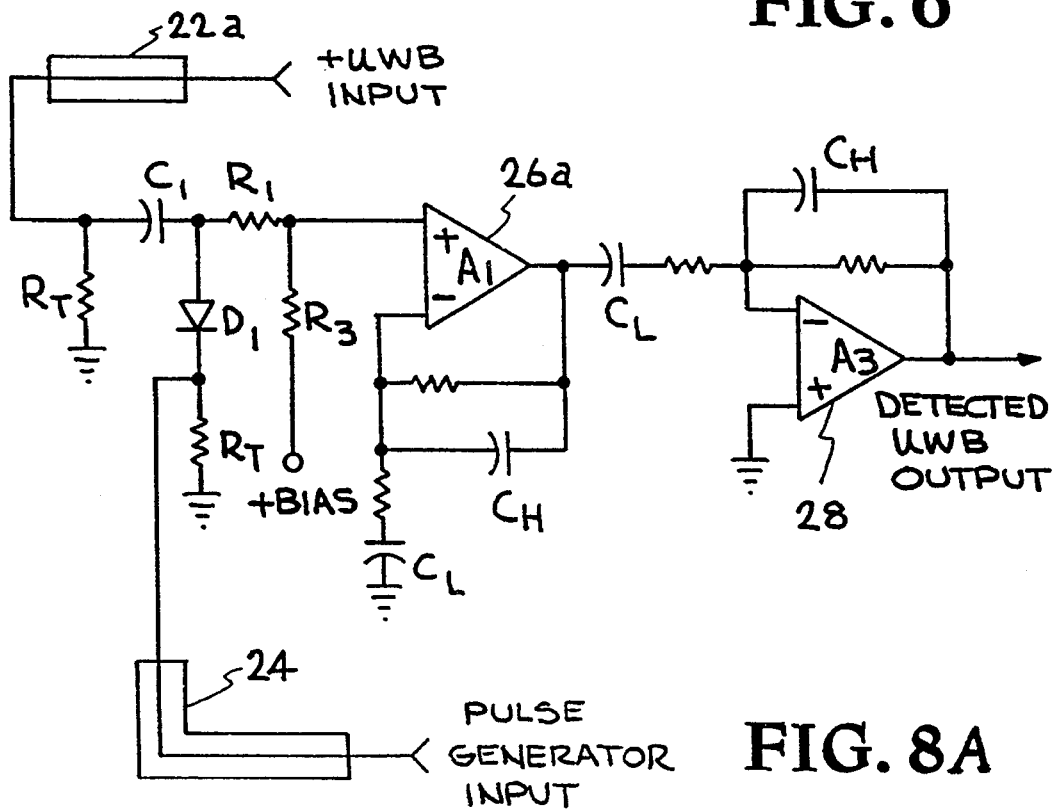
FIG. 8a is a schematic diagram of a single ended UWB receiver.

The –UWB input and associated circuitry shown in FIG. 2b may be deleted to form a SE detector as shown in FIG. 8a. The circuitry is identical to FIG. 2b except that the connections for amplifiers 26a and 28 to amplifier 26b are replaced by connections to ground. General SE voltage and current mode configurations are shown in FIGS. 1c,d. This configuration is usable in non-dithered, high signal level applications. A primary limitation is that variations in gate pulse generator width, amplitude, and PRI appear superimposed on the detected UWB signal output. Nevertheless, the SE configuration may be applied to very low cost sensors, such as short range UWB radar hidden object locators.

Figure 8B:
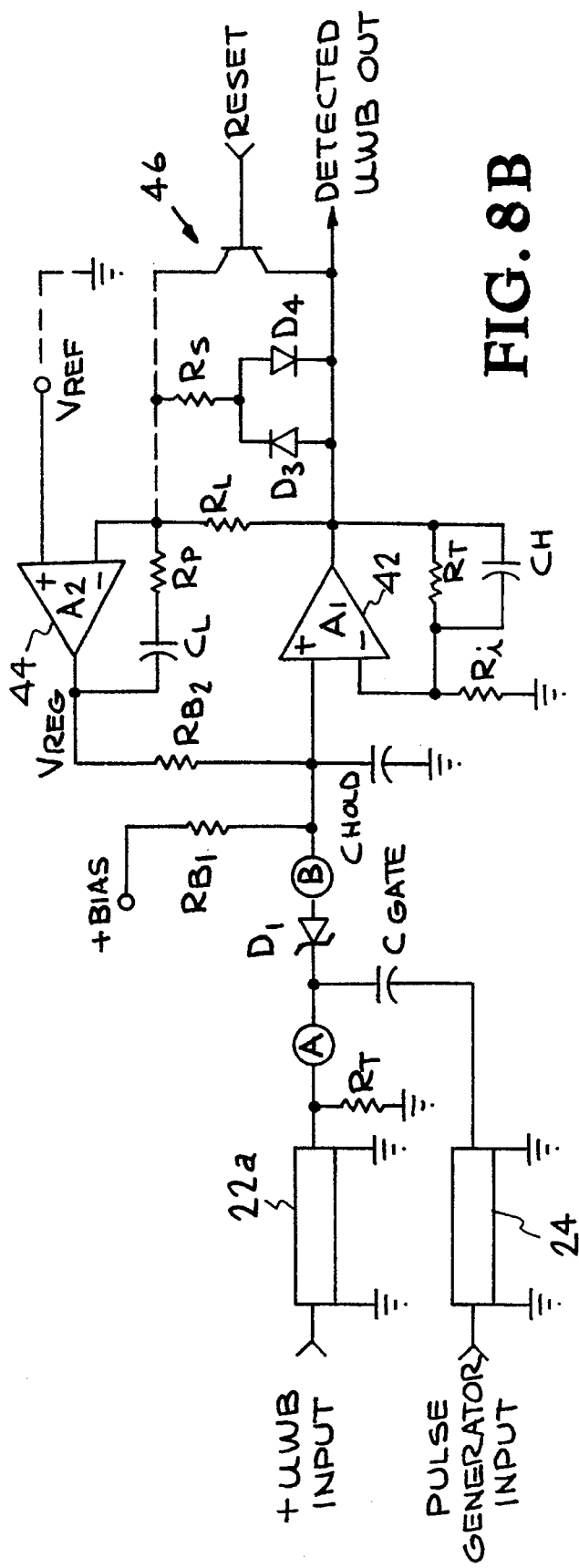
FIG. 8b is a schematic diagram of a single ended UWB receiver which is self-regulating and has a single detector diode.

FIG. 8b shows a single ended receiver with a single detector diode and a self-regulating amplifier. The gate pulse is injected at the antenna node. This detector diode configuration uses fewer components than previously described and generally works as well.

The +UWB input is connected through transmission line 22a to the cathode of a Schottky diode D1 whose anode is connected to the positive input of a first operational amplifier (A1) 42. Line 22a is terminated by a resistor $R_T$. The pulse generator (strobe) input is connected through capacitor $C_{gate}$ to the cathode of diode D1. Capacitor $C_{Hold}$ is connected from the positive input of amplifier 42 to ground, which helps block interfering RF from reaching operational amplifier 42. A +Bias source is connected to the positive input of amplifier 42 through a resistor $R_{B1}$. The output of amplifier 42, which is the detected UWB output, is connected through parallel resistor $R_f$ and capacitor $C_H$ to its negative input, which is also connected through resistor $R_i$ to ground.

Figure 8C:
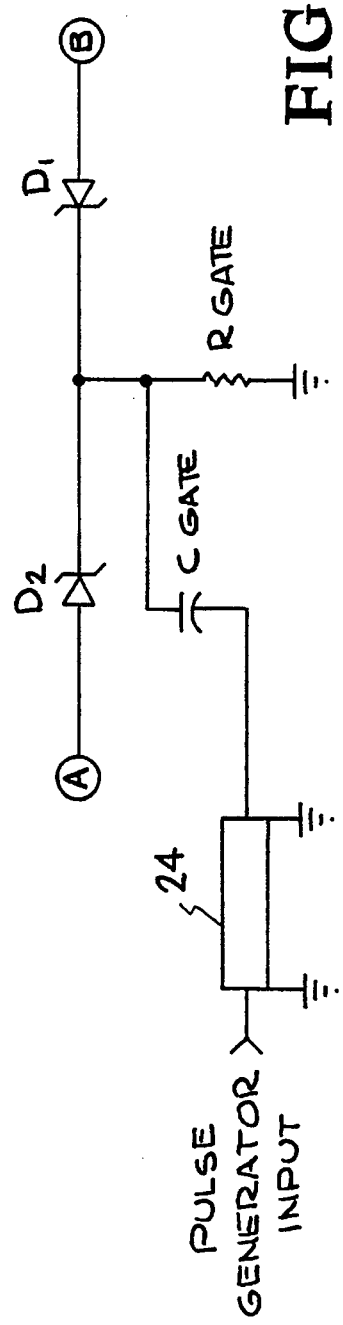
FIG. 8c shows an alternate two diode configuration for the single ended receiver of FIG. 8b.

The single Schottky diode D1 between points A and B of FIG. 8b can be replaced with a pair of Schottky diodes D1, D2, connected in series between points A and B, cathode to cathode, as shown in FIG. 8c. The pulse generator input is connected through transmission line 24 and capacitor $C_{gate}$ to the junction between the diodes, which is also connected to ground through resistor $R_{gate}$. The two diode configuration has the advantage of requiring less gate pulse drive, since $R_{gate}$ may be of a higher value, e.g. 330 ohms, compared to having to drive the resistor $R_T$=68 ohms in the single diode configuration. The lower drive requirement is an advantage when pushing gate aperture, or diode conduction interval, to a minimum.

The amplifier is configured as a self-regulating amplifier. Amplifier 42 is an operational amplifier configured for high gain, G=1+$R_f$/$R_i$~2000×, with a passband from DC to about 16 Hz, for motion sensing of humans. A feedback operational amplifier (A2) 44 is configured as a high gain integrator in the feedback path of amplifier 42, giving the net structure an AC coupled characteristic for detected UWB signals. Amplifier 44 has its negative input connected to the output of amplifier 42 through a resistor $R_L$, and its positive input connected to a reference voltage $V_{ref}$, which is typically ground. The output of amplifier 44, $V_{reg}$, is connected to the positive input of amplifier 42 through a resistor $R_{B2}$. The output of amplifier 44 is also connected back to its negative input through a series capacitor $C_L$ and resistor $R_p$.

Amplifier 44 regulates the detected UWB output and forces it to equal $V_{ref}$, on the average. Since $V_{ref}$ is typically at ground potential, the detected signal swings about zero volts. Since amplifier 42 is referenced to zero volts, or ground, through $R_i$, its positive input must also equal zero, and is held at zero through the regulating action of amplifier 44. This is very important since both point A and point B are at zero volts, on the average, and so the leakage current in the detector diode(s) must also be zero. Thus the circuit is independent of diode leakage current. Shottky diode leakage current can be quite high and can easily dominate bias levels and circuit noise. Both problems are eliminated with this circuit.

The low frequency time constant of the circuit is defined by $R_L C_L$ divided by the gain seen from the amplifier 44 output node to the $R_L$ input node, typically 100×. Resistor $R_p$ provides phase lead for good transient response. Resistor $R_{B1}$ is selected so $V_{reg}$ is normally at 0.0 V, so $C_L$ normally has zero volts across it and does not need to charge up at turn on. This feature is very important in some applications such as backup warning radar that is powered by a "reverse" switch in a car. The radar needs to power up and settle to normal operating levels in less than one second. It is not possible to have long time constant circuits settle quickly, unless their initial and final voltages are the same, e.g. zero. An additional method of achieving fast turn-on settling is to use a reset FET 46 connected across $R_L$, which is gated on during power-up to provide a low impedance path across $R_L$ to hasten settling. Fast response during large excursions is realized with a nonlinear feedback network formed of a pair of parallel back to back diodes D3, D4 with a series resistor $R_s$ across $R_L$ to speed settling to large input signals, such as from near proximity motions.

Figure 9A:
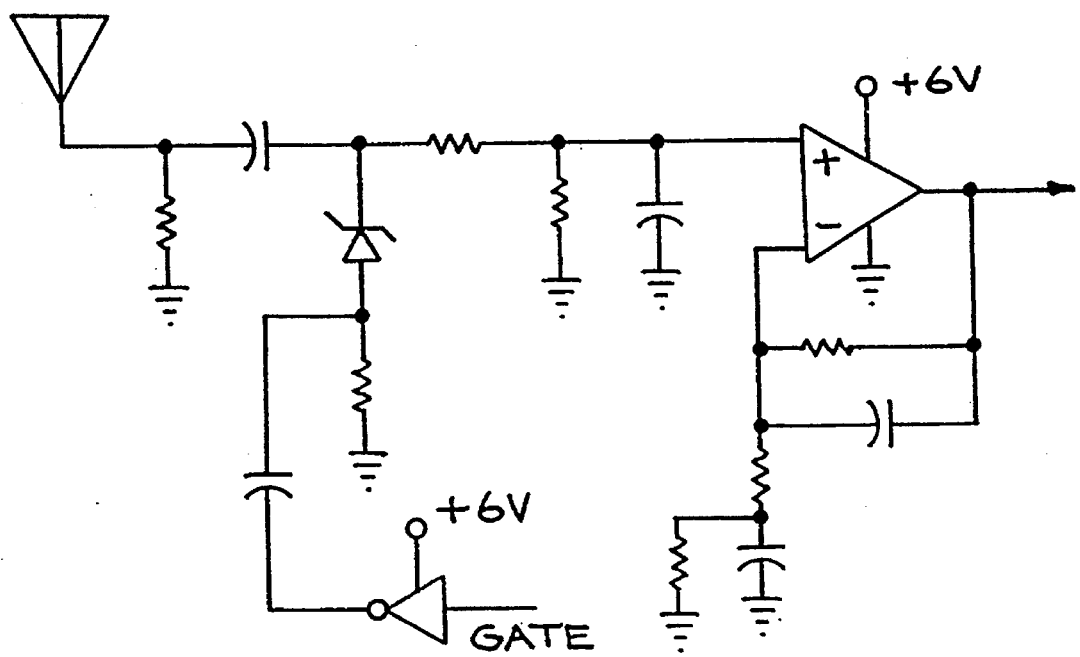
FIGS. 9a,b are schematic diagrams of voltage and current mode configurations of a single operational amplifier receiver/alarm.
Figure 9B:
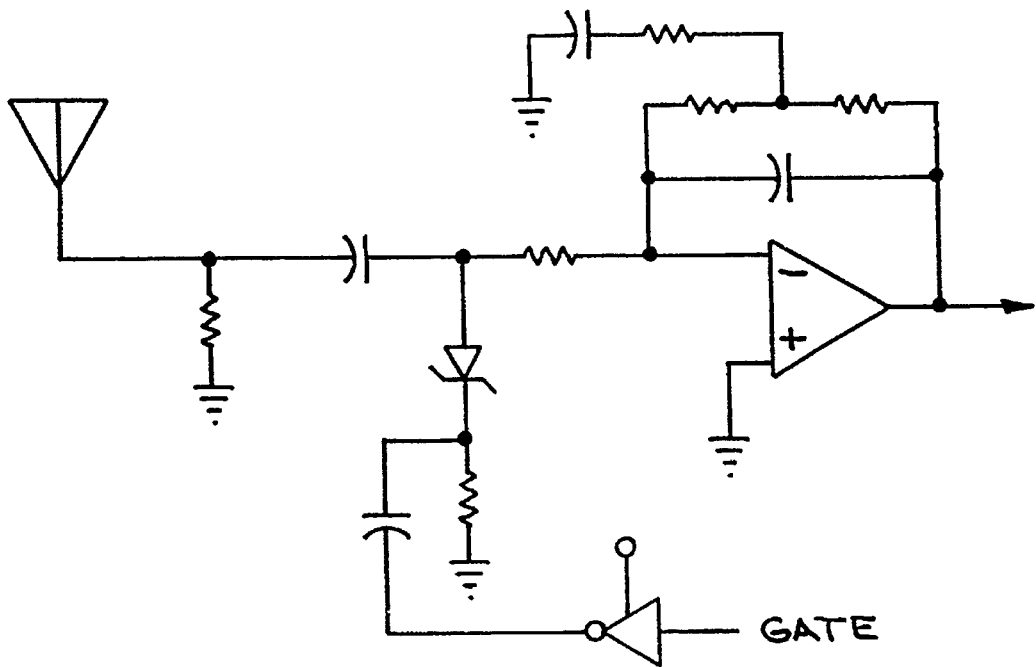

As shown in FIG. 9a, a receiver/alarm circuit is formed of a single operation amplifier, e.g. TLC 27L2, connected to a 15" wire antenna. A gating pulse is applied from a 74HC04 CMOS inverter through diode 1N5711 to the input channel. A typical gate pulse is 1 V, 2 ns wide. The corresponding current mode circuit is shown in FIG. 9b.

Figure 10A:
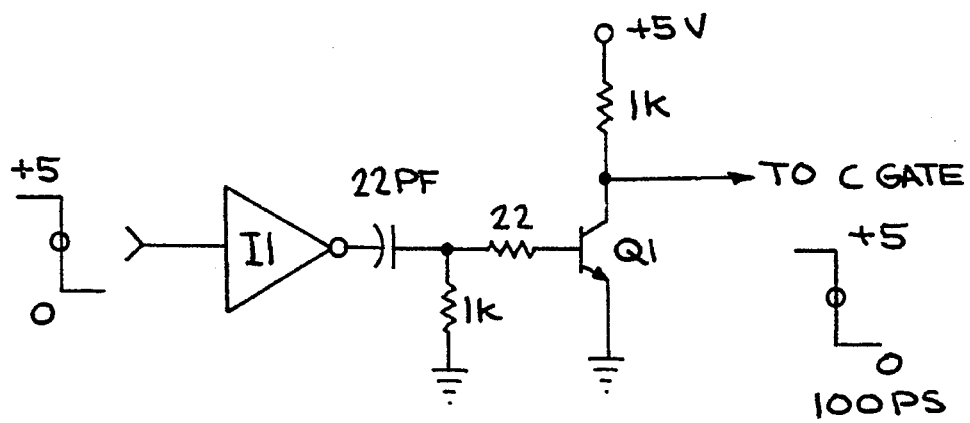
FIGS. 10a,b,c are schematic diagrams of three gate pulse generators.
Figure 10B:
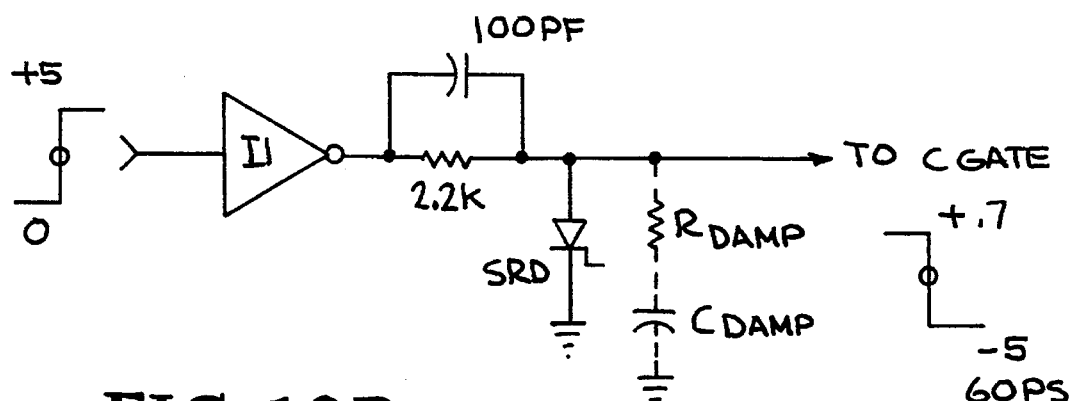
Figure 10C:
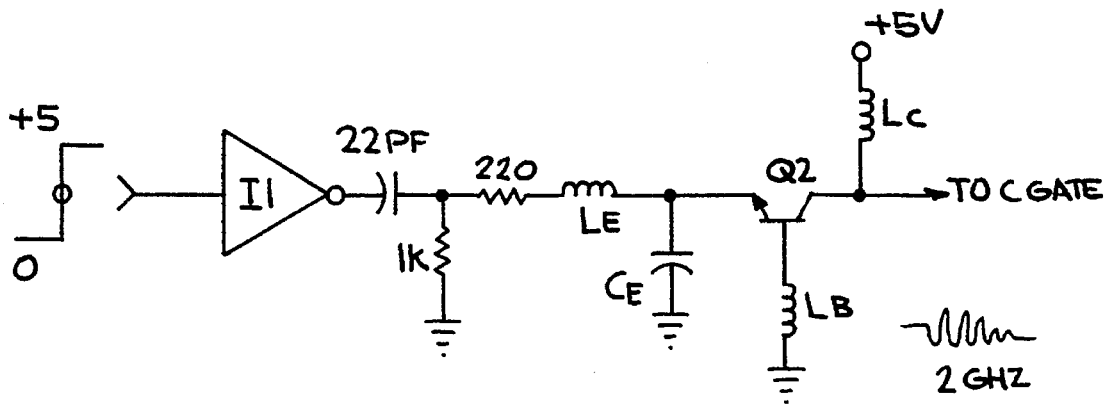

Three embodiments of gate pulse generators for the UWB receiver are illustrated in FIGS. 10a,b,c. All are driven by a CMOS inverter I1, e.g. 74ACXX. In FIG. 10a, the CMOS inverter drives a bipolar transistor Q1, e.g. BFR92. This provides a cheap and easy way to produce a fast pulse. A pulse forming network (PFN) or differentiator, e.g. formed of a 22 pf capacitor and 1K parallel resistor, is placed between the CMOS inverter and bipolar transistor. In FIG. 10b, CMOS inverter I1 drives a step recovery diode (SRD). A bias network, e.g. formed of a 2.2K resistor and parallel 100 pf capacitor, is placed between the inverter and SRD. An optional damping circuit, formed by series $R_{damp}$ and $C_{damp}$, can be placed in parallel with the SRD. In FIG. 10c, the CMOS inverter I1 drives an RF oscillator. The oscillator is a standard Colpitts type oscillator formed with bipolar transistor Q2. A PFN or differentiator similar to FIG. 10a is placed between the inverter and oscillator. The differentiated signal from the PFN provides an envelope for the oscillator output, i.e. the PFN modulates the oscillator output.

This invention will find widespread use in impulse radar. Particular applications include security alarms and automotive collision sensing of range, motion and velocity; robotics control and fluid level sensing; medical imaging, subsurface imaging, non-destruction evaluation (NDE) and security imaging.

UWB motion sensors based on this invention are described in copending U.S. patent application Ser. No. 08/044,717 filed Apr. 12, 1993, now U.S. Pat. No. 5,361,070, issued Nov. 1, 1994, entitled "Ultra-Wideband Radar Motion Sensors".

This invention makes an excellent spread spectrum communications receiver. Its high detection efficiency results in a low noise figure, unlike prior art samplers, and it rejects aberrations caused by modulated PRI, an essential characteristic of impulsive spread-spectrum systems. One example of an impulsive spread-spectrum system would be a cordless telephone with direct digital, or time-domain, channel selection of millions of channels, thus opening more spectrum usage while are the same time making eavesdropping nearly impossible.

Since this invention does not require transformers or baluns, it is suitable for monolithic integration. This invention will help pave the way for single-chip, low cost impulse radars and spread-spectrum communications.

Changes and modifications in the specifically described embodiments can be carried out without departing from the scope of the invention which is intended to be limited only by the scope of the appended claims.

I claim:

1. A single ended ultra-wideband (UWB) receiver, comprising:

a self-regulating amplifier which maintains a predetermined average output voltage;

an input channel connected to one input of the amplifier;

strobing means connected to the input channel.

2. The UWB receiver of claim 1, further comprising:

a single Schottky detector diode in the input channel, wherein the strobing means is connected to the input channel before the detector diode.

3. The UWB receiver of claim 1, further comprising:

a pair of series connected Schottky detector diodes in the input channel, wherein the strobing means is connected between the pair of diodes.

4. The UWB receiver of claim 3, wherein the Schottky diodes are in a common cathode configuration.

5. The UWB receiver of claim 2, wherein the self-regulating amplifier maintains an average of zero volts across the Schottky diode.

6. The UWB receiver of claim 4, wherein the self-regulating amplifier maintains an average of zero volts across the pair of Schottky diodes.

7. The UWB receiver of claim 1, wherein the self-regulating amplifier comprises:

a first operational amplifier connected as a high gain amplifier, a second operational amplifier connected as an integrator in feedback across the first operational amplifier.

8. The UWB receiver of claim 7, wherein the second operational amplifier has a reference input and a second input connected to the output of the first operational amplifier to maintain the output of the first operational amplifier at a reference voltage set at the reference input of the second operational amplifier.

9. The UWB receiver of claim 8, wherein the reference voltage is zero.

10. The UWB receiver of claim 1 wherein the strobing means comprises a CMOS inverter driving a bipolar transistor through a pulse forming network.

11. The UWB receiver of claim 1, wherein the strobing means comprises a CMOS inverter driving a step recovery diode through a bias network.

12. The UWB receiver of claim 1, wherein the strobing means comprises a CMOS inverter driving an oscillator through a pulse forming network.

13. The UWB receiver of claim 12, wherein the oscillator is a Colpitts oscillator.

14. The UWB receiver of claim 12, wherein the pulse forming network produces a modulating envelope for the oscillator output.

* * * * *